(12) United States Patent
Jiang et al.

(10) Patent No.: US 6,388,199 B1
(45) Date of Patent: May 14, 2002

(54) SELECTIVELY ADJUSTING SURFACE TENSION OF SOLDERMASK MATERIAL

(75) Inventors: Tongbi Jiang; Partrick Tandy, both of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/628,833

(22) Filed: Jul. 31, 2000

(51) Int. Cl.$^7$ .................................................. H05K 1/03
(52) U.S. Cl. ........................................ 174/255; 174/260
(58) Field of Search .............................. 174/255, 260; 361/748–751

(56) References Cited

U.S. PATENT DOCUMENTS 5,389,497 A * 2/1995 Yoshioka et al. ........... 430/315
5,500,315 A * 3/1996 Calvert et al. ................ 430/16
5,903,041 A * 5/1999 La Fleur et al. ............ 257/530
6,137,634 A * 10/2000 Li .............................. 359/619
6,207,346 B1 * 3/2001 Johnson .................... 430/284.1

* cited by examiner

Primary Examiner—Albert W. Paladini
Assistant Examiner—Jeremy Norris
(74) Attorney, Agent, or Firm—Fletcher, Yoder & Van Someren

(57) ABSTRACT

A method of selectively adjusting surface tension of a soldermask material. Specifically, a method of selectively adjusting the surface tension of a soldermask material to promote adhesion of a molding compound in a ball grid array package while maintaining a low surface tension on the ball attach area to prevent bridging between the solder balls. Solder balls require a low surface tension soldermask to minimize bridging, while the molding compound requires a high surface tension to provide adequate adhesion to the surface of the soldermask. By exposing selected portions of the soldermask to an activation method, such as ultra-violet radiation, the surface tension of the soldermask can be varied such that different areas of the package exhibit different surface tensions.

18 Claims, 3 Drawing Sheets

SELECTIVELY ADJUSTING SURFACE TENSION OF SOLDERMASK MATERIAL

BACKGROUND OF THE INVENTION

1. Field of the Invention

The present invention relates generally to integrated circuit fabrication and, more particularly, to the inspection of semiconductor wafers.

2. Background of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Microprocessor-controlled circuits are used in a wide variety of applications. Such applications include personal computers, control systems, telephone networks, and a host of consumer products. As is well known, microprocessors are essentially generic devices that perform specific functions under the control of a software program. This program is stored in a memory device coupled to the microprocessor.

The devices used in typical microprocessor controlled circuits are usually formed on a semiconductor die and placed in a package. Many such devices are packaged for surface mounting. Fine-Pitch Surface Mount Technology (FPT) and Pin Grid Array (PGA) technology are well developed areas of this type of packaging technology. In addition, an emerging packaging method has been developed using Ball Grid Array (BGA) technology.

A BGA semiconductor package generally includes an integrated circuit (I/C) chip mounted on the upper surface of a substrate. The I/C chip may be electrically coupled to the substrate by bonding wires or conductive paste, for example. The substrate contains conductive routing which allows the signals to pass from the I/C chip on the upper surface of the substrate, through the substrate, and to pads on the underside of the substrate. A plurality of solder balls are deposited and electrically coupled to the pads on the underside of the substrate to be used as input/output terminals for electrically connecting the substrate to a printed circuit board (PCB) or other external device.

The packaging of electrical circuits is a key element in the technological development of any device containing electrical components. A single I/C device is typically encapsulated within a sealed package to be mounted on a PCB or another suitable apparatus for incorporation into a system. The I/C package is generally encapsulated within a molding compound to protect the die from external contamination or physical damage. The encapsulated package also provides a system of interconnects for electrically coupling the package to a PCB or other external device.

Three common techniques for mounting an I/C chip on a substrate include Chip-on-Board (COB), Board-on-Chip (BOC), and Flip-Chip (F/C). In a COB package, the I/C chip may be attached to the substrate "face-up." That is to say that the side of the I/C chip containing the bond pads for wire bonding the chip to the substrate is left exposed. This side is often referred to as the upper surface of the chip. The backside of the I/C chip not containing the bond pads is adhered to the substrate. In this type of package, bona wires are attached from the upper surface of the I/C chip and to pads on the upper surface of the substrate to electrically couple the I/C chip to the substrate. The substrate contains electrical routing which routes the signals from the upper surface of the substrate to the underside of the substrate.

Alternately, the I/C chip may be mounted on the substrate "face-down" to create a BOC package. In this instance, the substrate typically contains a slot. Since the I/C chip is mounted face down, the bond pads on the upper surface of the chip are arranged to correlate with the slot opening in the substrate. Bond wires are attached from the bond pads on the chip, through the slot in the substrate, and to the underside of the substrate. The substrate contains electrical routing to distribute electrical signals along the back side of the substrate.

For F/C packages, the I/C chip is mounted on the substrate face-down, as in the BOC package. For a F/C package, bond wires are not used to electrically couple the I/C chip to the substrate. Instead, solder bumps located on the face of the chip are aligned with conductive pads on the upper surface of the substrate. The solder bumps may be re-flowed to electrically couple the chip to the substrate. The substrate contains electrical routing to distribute electrical signals from the I/C chip along the backside of the substrate.

Regardless of whether COB, BOC, or F/C mounting techniques are used, the package is generally encapsulated in a molding compound to protect the I/C device and bond wires from external elements such as moisture, dust, or impact. A non-conductive material, such as soldermask (or solder resist), is generally disposed on the substrate to cover the conductive traces. However, ball pads and bond wire pads are typically left exposed for electrical coupling of the integrated circuit device to the substrate and for electrical coupling of the integrated circuit package to other external devices.

Disadvantageously, the low surface tension of the soldermask may not provide an adequate surface on which to adhere the molding compound. To promote adhesion, the surface tension of the soldermask may be altered by a technique such as ultraviolet (UV) bumping. By exposing the soldermask to UV radiation, the surface tension of the soldermask is generally increased, thereby promoting surface adhesion of the molding compound. However, increasing the surface tension creates another problem associated with BGA surface mounting techniques. Solder balls generally require a low surface tension soldermask to minimize bridging problems. The higher the surface tension of the soldermask which is surrounding the ball pads, the greater the likelihood of bridging between the solder balls. Thus, the variance of surface tension creates a design issue with a dichotomous solution: Increase the surface tension of the soldermask to promote adhesion of the molding compound or decrease the surface tension of the soldermask to reduce bridging between the solder balls.

The present invention may address one or more of the problems set forth above.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In one embodiment of the present invention, there is provided a system including processor and an integrated circuit package operatively coupled to the processor. The integrated circuit package includes: a substrate having a first surface and a second surface, the second surface configured to receive a plurality of solder balls thereon; an integrated circuit die coupled to the first surface of the substrate; a solder resist disposed on the second surface of the substrate, the solder resist having a first portion having a first surface tension and a second portion having a second surface tension, the first surface tension being higher than the second surface tension; and a molding compound disposed on the first portion of the solder resist.

In another embodiment of the present invention, there is provided an integrated circuit package including: a substrate having a first surface and a second surface, the second surface configured to receive a plurality of solder balls thereon; an integrated circuit die coupled to the first surface of the substrate; a solder resist disposed on the second surface of the substrate, the solder resist having a first portion having a first surface tension and a second portion having a second surface tension, the first surface tension being higher than the second surface tension; and a molding compound disposed on the first portion of the solder resist.

In still another embodiment of the present invention, there is provide a board comprising a substrate having a first surface and a second surface, the second surface configured to receive a plurality of solder balls thereon and a solder resist disposed on the second surface of the substrate, the solder resist having a first portion having a first surface tension and a second portion having a second surface tension, the first surface tension being higher than the second surface tension.

In yet another embodiment of the present invention, there is provided a method of manufacturing an integrated circuit package comprising the acts of: (a) providing a substrate having a first surface and a second surface, the second surface configured to receive a plurality of solder balls thereon; (b) disposing a solder resist onto the second surface of the substrate; (c) selectively raising the surface tension of the solder resist to create a first portion of the solder resist having a first surface tension and a second portion of the solder resist having a second surface tension higher than the first surface tension; (d) disposing a molding compound on the second portion of the solder resist; and (e) disposing an integrated circuit die on the first surface of the substrate.

BRIEF DESCRIPTION OF THE DRAWINGS

The foregoing and other advantages of the invention will become apparent upon reading the following detailed description and upon reference to the drawings in which.

DESCRIPTION OF SPECIFIC EMBODIMENTS

One or more specific embodiments of the present invention will be described below. In an effort to provide a concise description of these embodiments, not all features of an actual implementation may be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
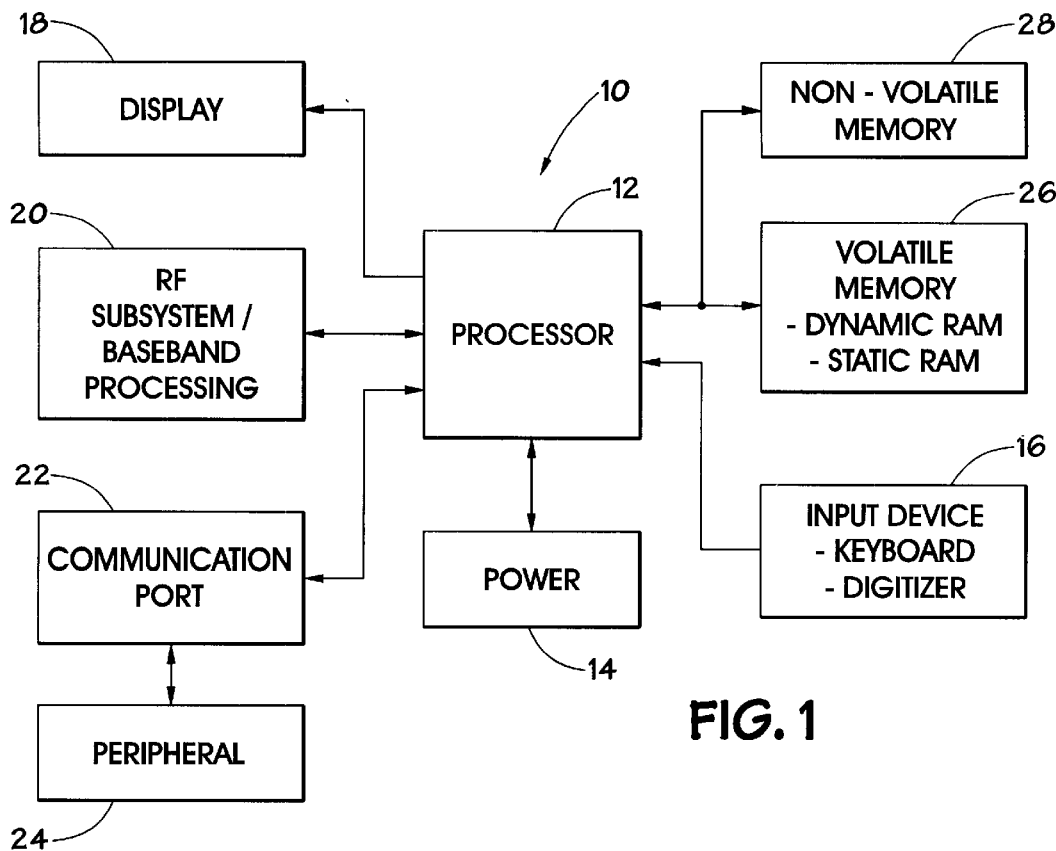
FIG. 1 illustrates a block diagram of an exemplary processor-based device in accordance with the present invention.

Turning now to the drawings, and referring initially to FIG. 1, a block diagram depicting an exemplary processor-based device, generally designated by the reference numeral 10, is illustrated. The device 10 may be any of a variety of different types, such as a computer, pager, cellular telephone, personal organizer, control circuit, etc. In a typical processor-based device, a processor 12, such as a microprocessor, controls many of the functions of the device 10.

The device 10 typically includes a power supply 14. For instance, if the device 10 is portable, the power supply 14 would advantageously include permanent batteries, replaceable batteries, and/or rechargeable batteries. The power supply 14 may also include an A/C adapter, so that the device may be plugged into a wall outlet, for instance. In fact, the power supply 14 may also include a D/C adapter, so that the device 10 may be plugged into a vehicle's cigarette lighter, for instance.

Various other devices may be coupled to the processor 12, depending upon the functions that the device 10 performs. For instance, a user interface 16 may be coupled to the processor 12. The user interface 16 may include buttons, switches, a keyboard, a light pin, a mouse, and/or a voice recognition system, for instance. A display 18 may also be coupled to the processor 12. The display 18 may include an LCD display, a CRT, LEDs, and/or an audio display. Furthermore, an RF subsystem/baseband processor 20 may also be coupled to the processor 12. The RF subsystem/baseband processor 20 may include an antenna that is coupled to an RF receiver and to an RF transmitter (not shown). A communications port 22 may also be coupled to the processor 12. The communications port 22 may be adapted to be coupled to a peripheral device 24, such as a modem, a printer, or a computer, for instance, or to a network, such as a local area network or the Internet.

Because the processor 12 controls the functioning of the device 10 generally under the control of software programming, memory is coupled to the processor 12 to store and facilitate execution of the program. For instance, the processor 12 may be coupled to volatile memory 26, which may include dynamic random access memory (DRAM) and/or static random access memory (SRAM). The processor 12 may also be coupled to non-volatile memory 28. The non-volatile memory 28 may include a read only memory (ROM), such as an EPROM or Flash-Memory, to be used in conjunction with the volatile memory. The size of the ROM is typically selected to be just large enough to store any necessary operating system, application programs, and fixed data. The volatile memory, on the other hand, is typically quite large so that it can store dynamically loaded applications. Additionally, the non-volatile memory 28 may include a high capacity memory such as a disk or tape drive memory.

Figure 2:
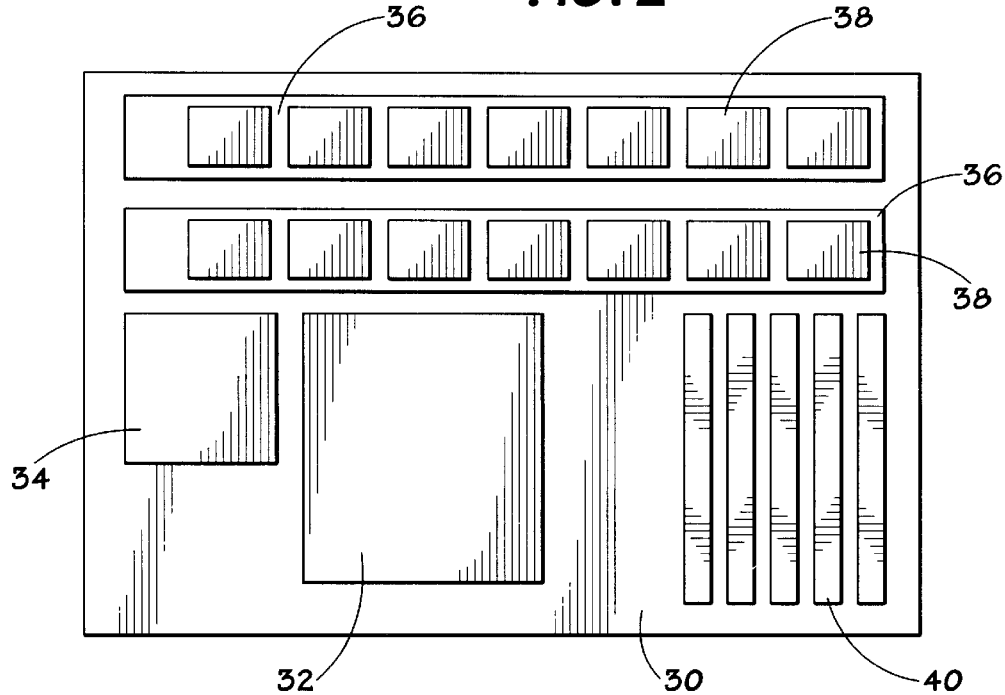
FIG. 2 illustrates a plan view of a circuit board having various devices employed thereon.

Referring to FIG. 2, a circuit board 30 is shown having various devices and connections coupled to its surface. A microprocessor 32 is shown along with a ROM device 34 and a set of memory modules 36, each containing a plurality of RAM chips 38. A plurality of connections or ports 39 are also located on the circuit board 30 allowing for connection to various peripheral devices and expansion modules. In a computer application, for example, such devices and expansion modules might include sound cards, video cards, additional memory modules or connections for input and output peripherals. While the present embodiment has a direct relation to memory chips such as the ROM device 34 and RAM chip 38, the techniques described below, may be applied to any device package having similar mounting characteristics including, if desired, the microprocessor 32.

Figure 3:
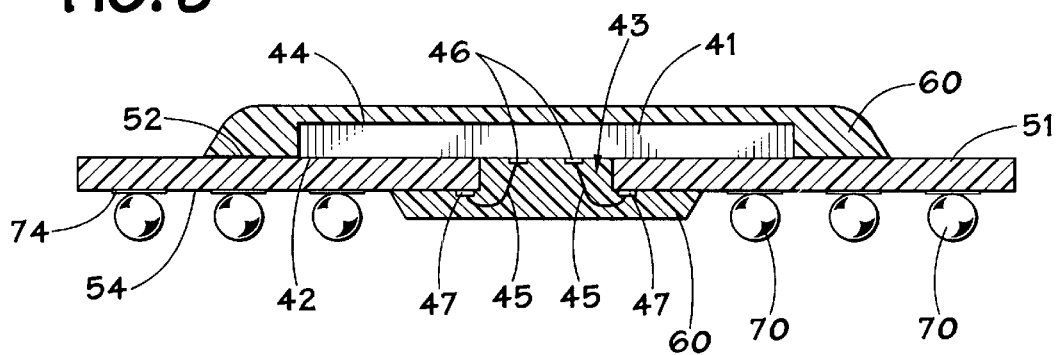
FIG. 3 illustrates a cross sectional view of a BGA package in accordance with the present invention.

FIG. 3 illustrates a partial cross-sectional view depicting an exemplary encapsulated I/C package 40. The I/C package 40 typically includes an I/C chip 41, such as a memory chip or microprocessor chip. The I/C chip 41 is mounted on a substrate 51 and electrically coupled to the substrate 51 by bond wires 45. A molding compound 60 is generally used to encapsulate the I/C chip 41. The molding compound 60 protects the I/C chip 41 and the bond wires 45 from external elements. Terminals, such as pins or solder balls 70, may be disposed on the backside of the substrate 51 so that the I/C package 40 may be electrically coupled to a printed circuit board (PCB) to incorporate the I/C package 40 into a system.

The substrate 51 also includes conductive routing and/or vias (not shown) to provide an electrical signal path from the solder pads 47 to the solder balls 70. In this example, a slot 43 is formed in the substrate 51. The bond pads 46 on the first surface 42 of the I/C chip 41 are aligned with the slot 43 so as to allow bond wires 45 to be attached between bond pads 46 on the first surface 42 of the I/C chip 41 and the bond pads 47 on the second surface 54 of the substrate 51. During the encapsulation process, molding compound 60 may be disposed on the second surface 44 of the I/C chip 41 which is not in contact with the substrate 51, and the molding compound 60 may be disposed on the first surface 52 of the substrate 51. The molding compound 60 may be disposed through the slot 43 in the substrate 51 and on a portion of the second surface 54 of the substrate 51.

Figure 4:
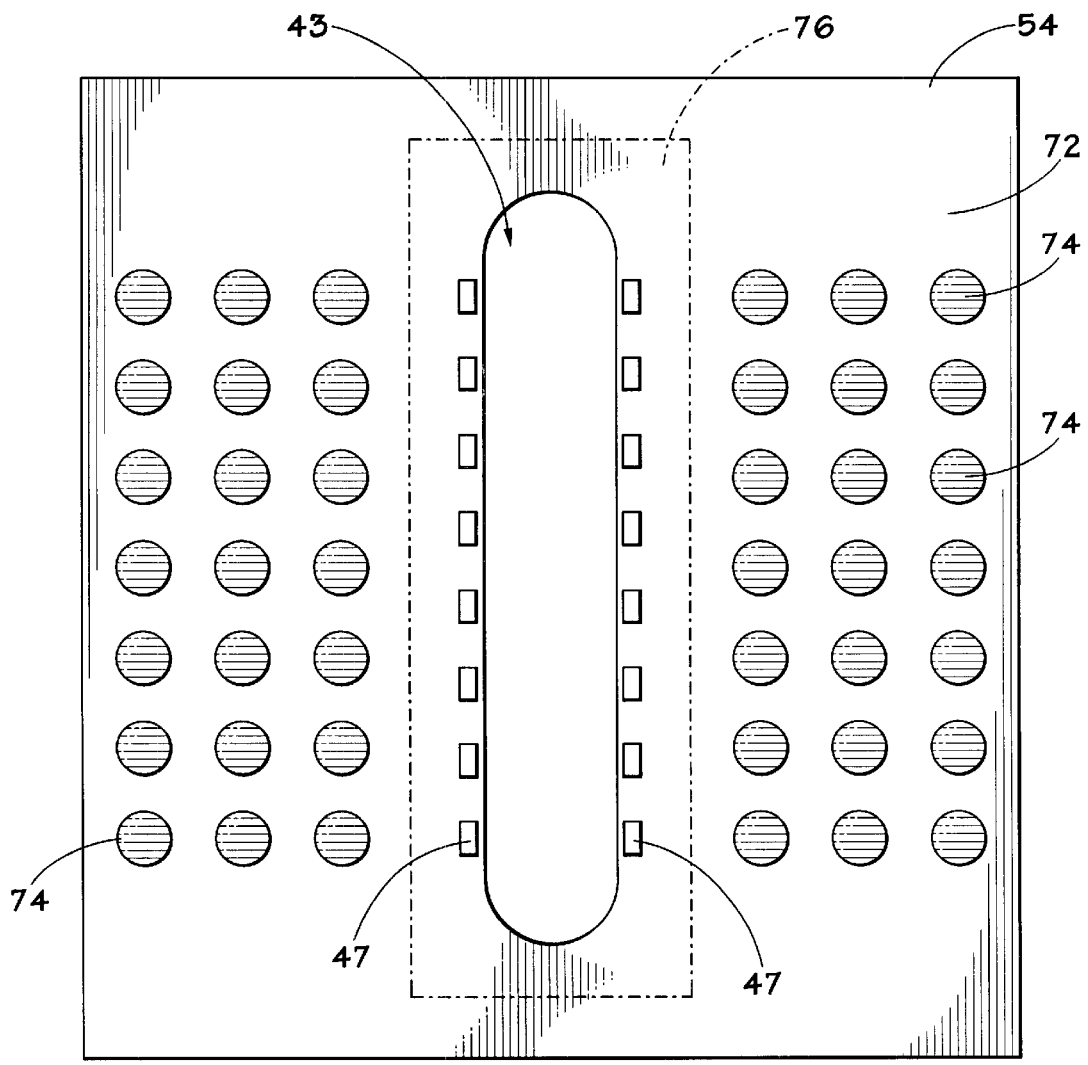
FIG. 4 illustrates a plan view of the backside of a BGA package in accordance with one embodiment of the present invention.
Figure 5:
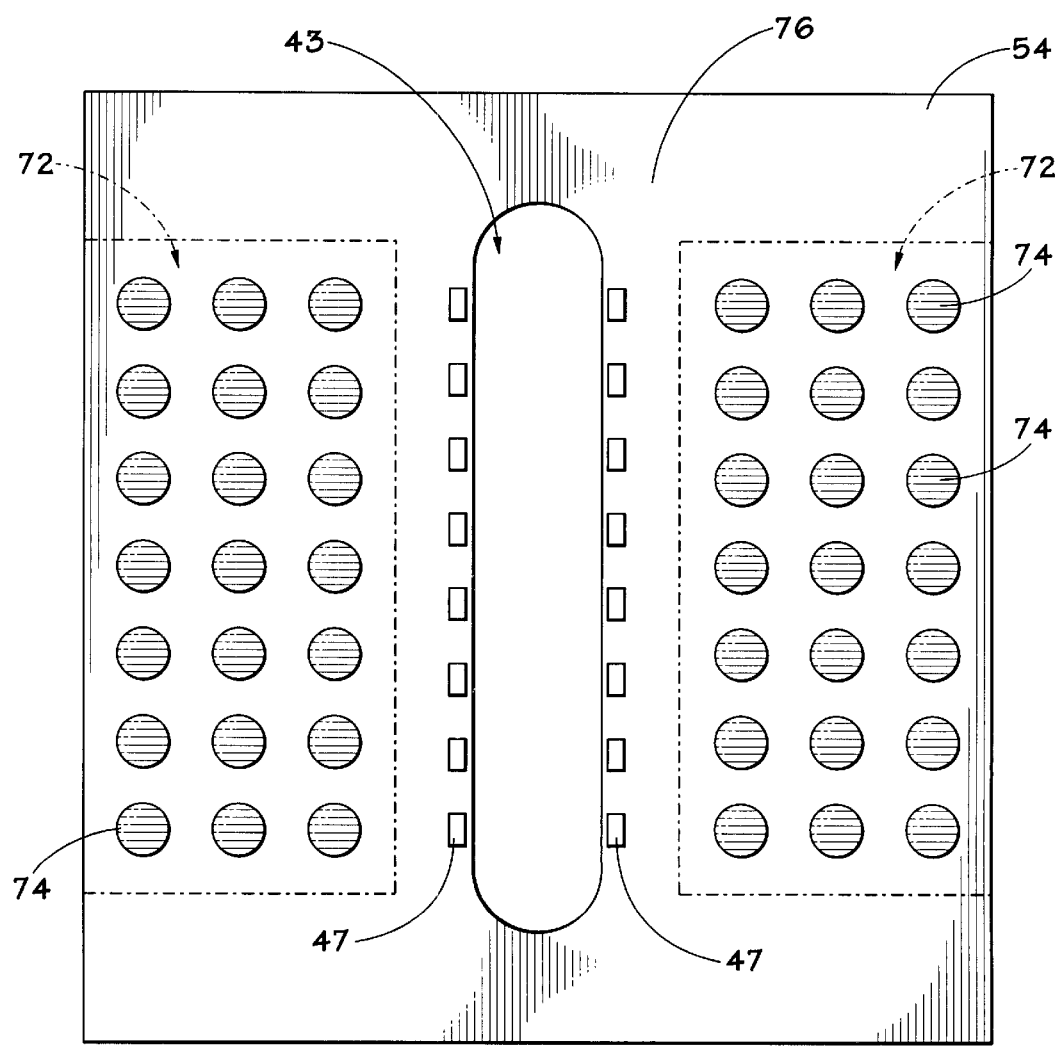
FIG. 5 illustrates a plan view of the backside of a BGA package in accordance with art alternate embodiment of the present invention.

The outer surfaces 52 and 54 of the substrate 51 are covered with soldermask 72 to protect the substrate 51 and to reduce the solder bridging of the solder balls 70 during re-flow. Referring to FIGS. 3–5, the soldermask 72 is present on the backside 54 of the substrate 51. Solder ball pads 74 and bond wire pads 47 are left exposed such that the pads in 47 and 74 may be used for electrical coupling. One of the purposes of using soldermask 72 to cover the backside 54 of the substrate 51 is to minimize bridging between the solder balls 70 which is created when the solder balls 70 are re-flowed during deposition onto the solder pads 74. The low surface tension of the soldermask tends to minimize the bridging problem. However, the molding compound 60 which is disposed on the substrate 51 to protect the electrical connections between the I/C device 41 and the substrate 47 requires a high surface tension to provide adequate adhesion for the molding compound 60. To increase the adhesion of the molding compound 60, an activation method such as a UV bump, downstream plasma etching, reactive ion etching, wet chemical etching, or radiation etching may be used. The activation of the soldermask material terminates the reactive dangling bonds on the soldermask and provides a high energy surface finish which will promote adhesion. Rather than expose the entire surface of the soldermask 72 to a UV bump, for example, it may be desirable to only expose a selective portion of the soldermask 72 to the UV bump. Specifically, by exposing only selective areas of the soldermask 72 which will receive the molding compound 60, such as area 76, the surface tension of the soldermask material 72 will advantageously be increased only in those specific areas. The areas of the soldermask 72 containing the solder ball pads 74 will be left unexposed to the UV radiation and, thus, the surface tension of the soldermask will remain low thereby mitigating the bridging problem associated with re-flow of the solder balls 70. FIGS. 4 and 5 illustrate two embodiments of the selective exposure patterns. Other patterns may also be used.

Several soldermask materials, such as AUS5, AUS7, and AUS9, available from Taiyo, Japan, may be used to coat the surfaces of the substrate 51. By exposing the soldermask 72 to a particular intensity of UV radiation, varying the development time, and/or varying the post cure time, the surface tension can be increased to promote adhesion (i.e. demote wetting). By varying the exposure intensity, development time, and/or the post cure time as well as the soldermask material, various surface tensions may be achieved. For optimal adhesion, the surface tension may measure 31–58 dyne/cm. Preferably, the surface tension may be 35–58 dyne/cm. It has been found through experimentation that by varying the development time after exposure to between 60 and 120 seconds, varying the post cure time to between 30 and 90 minutes, and varying the soldermask material, surface tension of over 31 dyne/cm may be achieved. Further, a combination of the selective activation methods may be used to filter increase the surface tension. For instance, by combining $O_2$ plasma treatment with UV exposure, a surface tension of 54–58 dyne/cm may be achieved.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A system comprising:
    a processor; and
    an integrated circuit package operatively coupled to the processor, the integrated circuit package comprising:
        a substrate having a first surface and a second surface, the second surface configured to receive a plurality of solder balls thereon;
        an integrated circuit die coupled to the first surface of the substrate;
        a solder resist disposed on the second surface of the substrate, the solder resist having a first portion having a first surface tension and a second portion having a second surface tension, the first surface tension being higher than the second surface tension; and
        a molding compound disposed on the first portion of the solder resist.

2. The system, as set forth in claim 1, wherein the substrate comprises a slot.

3. The system, as set forth in claim 2, wherein the integrated circuit die is coupled to the substrate in a board-on-chip fashion.

4. The system, as set forth in claim 1, wherein the integrated circuit die comprises one of a memory device and a microprocessor device.

5. The system, as set forth in claim 1, wherein solder balls are disposed on the second portion of the second surface.

6. The system, as set forth in claim 1, wherein the surface tension of the first portion of the solder resist is at least 31 dynes/cm.

7. The system, as set forth in claim 1, wherein the surface tension of the first portion of the solder resist is at least 54 dynes/cm.

8. An integrated circuit package comprising:
- a substrate having a first surface and a second surface, the second surface configured to receive a plurality of solder balls thereon;
- an integrated circuit die coupled to the first surface of the substrate;
- a solder resist disposed on the second surface of the substrate, the solder resist having a first portion having a first surface tension and a second portion having a second surface tension, the first surface tension being higher than the second surface tension; and
- a molding compound disposed on the first portion of the solder resist.

9. The package, as set forth in claim 8, wherein the substrate comprises a slot.

10. The package, as set forth in claim 9, wherein the integrated circuit die is coupled to the substrate in a board-on-chip fashion.

11. The package, as set forth in claim 8, wherein the integrated circuit die comprises one of a memory device and a microprocessor device.

12. The system, as set forth in claim 8, wherein solder balls are disposed on the second portion of the second surface.

13. The system, as set forth in claim 8, wherein the surface tension of the solder resist is at least 31 dynes/cm.

14. The system, as set forth in claim 8, wherein the surface tension of the solder resist is at least 54 dynes/cm.

15. A board comprising:
- a substrate having a first surface and a second surface, the second surface configured to receive a plurality of solder balls thereon; and
- a solder resist disposed on the second surface of the substrate, the solder resist having a first portion having a first surface tension and a second portion having a second surface tension, the first surface tension being higher than the second surface tension.

16. The board, as set forth in claim 15, wherein the substrate comprises a slot.

17. The board, as set forth in claim 16, wherein the integrated circuit die is coupled to the substrate in a board-on-chip fashion.

18. The system, as set forth in claim 15, wherein solder balls are disposed on the second portion of the second surface.

* * * * *

UNITED STATES PATENT AND TRADEMARK OFFICE
CERTIFICATE OF CORRECTION

PATENT NO.    : 6,388,199 B1
DATED         : May 14, 2002
INVENTOR(S)   : Tongbi Jiang and Patrick Tandy It is certified that error appears in the above-identified patent and that said Letters Patent is hereby corrected as shown below:

<u>Title page,</u>
Item [75], Inventors, should be corrected as follows:
-- Tongbi Jiang; Patrick Tandy, both of Boise, ID. --

Signed and Sealed this

Twenty-sixth Day of August, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,388,199 B1
DATED : May 14, 2002
INVENTOR(S) : Tongbi Jiang and Patrick Tandy It is certified that error appears in the above-identified patent and that said Letters Patent is hereby corrected as shown below:

Title page,
Item [75], Inventors, should be corrected as follows:
-- Tongbi Jiang; Patrick Tandy, both of Boise, ID. --.

Column 8,
Lines 1-3, should be corrected as follows:
-- The package, as set forth in claim 8, wherein solder balls are disposed on the second portion of the second surface. --.
Lines 4-5, should be corrected as follows:
-- The package, as set forth in claim 8, wherein the surface tension of the solder resist is at least 31 dynes/cm. --.
Lines 6-7, should be corrected as follows:
-- The package, as set forth in claim 8, wherein the surface tension of the solder resist is at least 54 dynes/cm. --.
Lines 24-26, should be corrected as follows:
-- The board, as set forth in claim 15, wherein solder balls are disposed on the second portion of the second surface. --.

Signed and Sealed this

Sixth Day of September, 2005

JON W. DUDAS
*Director of the United States Patent and Trademark Office*